United States Patent
Win et al.

(10) Patent No.: US 8,349,537 B2
(45) Date of Patent: Jan. 8, 2013

(54) PHOTOSENSITIVE INK COMPOSITION FOR SCREEN PRINTING AND METHOD OF FORMING POSITIVE RELIEF PATTERN WITH USE THEREOF

(75) Inventors: Maw Soe Win, Yokohama (JP); Toshiyuki Goshima, Yokohama (JP); Sigemasa Segawa, Yokohama (JP); Shintaro Nakajima, Yokohama (JP); Eika Kyo, Yokohama (JP); Yoshikazu Nishikawa, Yokohama (JP); Shuzo Waki, Yokohama (JP)

(73) Assignee: PI R&D Co., Ltd., Yokohama-Shi (JP)

( * ) Notice: Subject to any disclaimer, the term of this patent is extended or adjusted under 35 U.S.C. 154(b) by 0 days.

(21) Appl. No.: 13/007,373

(22) Filed: Jan. 14, 2011

(65) Prior Publication Data

US 2011/0111351 A1 May 12, 2011

Related U.S. Application Data

(63) Continuation of application No. 12/224,593, filed as application No. PCT/JP2007/054007 on Mar. 2, 2007, now abandoned.

(30) Foreign Application Priority Data

Mar. 3, 2006 (JP) ................................. 2006-057273

(51) Int. Cl.
- G03F 7/00 (2006.01)
- G03F 7/004 (2006.01)
- C08G 77/04 (2006.01)

(52) U.S. Cl. ...................... 430/270.1; 430/322; 430/913; 430/945; 430/905; 430/326; 528/26; 528/170; 528/353

(58) Field of Classification Search ............... 430/270.1, 430/945, 913, 905, 322; 528/353, 26, 170
See application file for complete search history.

(56) References Cited

U.S. PATENT DOCUMENTS

| | | | |
|---|---|---|---|
| 4,243,743 A | 1/1981 | Hiramoto et al. | |
| 5,252,703 A | 10/1993 | Nakajima et al. | |
| 5,281,690 A | 1/1994 | Flaim et al. | |
| 5,385,808 A | 1/1995 | Tokoh et al. | |
| 5,739,263 A | 4/1998 | Yoshida et al. | |
| 6,204,356 B1 | 3/2001 | Saito et al. | |
| 6,627,377 B1 | 9/2003 | Itatani et al. | |
| 6,677,099 B1 | 1/2004 | Ishii et al. | |
| 6,777,159 B1 | 8/2004 | Itatani et al. | |
| 6,780,960 B2 | 8/2004 | Hausladen et al. | |
| 6,890,626 B1 | 5/2005 | Itatani et al. | |
| 6,913,867 B2 | 7/2005 | Imai | |
| 7,015,260 B2 | 3/2006 | Meloni | |
| 7,220,490 B2 | 5/2007 | Dueber et al. | |
| 2004/0235992 A1 | 11/2004 | Okada et al. | |
| 2005/0272907 A1 | 12/2005 | Jin et al. | |
| 2007/0191552 A1 | 8/2007 | Ichiroku et al. | |

FOREIGN PATENT DOCUMENTS

| | | |
|---|---|---|
| EP | 1 024 407 A1 | 8/2000 |
| EP | 1 469 037 A1 | 10/2004 |
| JP | 54-145794 A | 11/1979 |
| JP | 61-118423 A | 6/1986 |
| JP | 62-184056 A | 8/1987 |
| JP | 62-273259 A | 11/1987 |
| JP | 3-170555 A | 7/1991 |
| JP | 40298093 A | 10/1992 |
| JP | 6-157875 A | 6/1994 |
| JP | 7-304950 A | 11/1995 |
| JP | 8-333455 A | 12/1996 |
| JP | 2003-113338 A | 4/2003 |
| JP | 2003-119285 A | 4/2003 |
| JP | 2003-345007 A | 12/2003 |
| JP | 2005-309027 A | 11/2005 |
| WO | WO-99/19771 A1 | 4/1999 |
| WO | WO-03/060010 A1 | 7/2003 |

*Primary Examiner* — Amanda C. Walke

(74) *Attorney, Agent, or Firm* — Birch, Stewart, Kolasch & Birch, LLP

(57) ABSTRACT

Disclosed is a photosensitive ink which can form a coated film that is excellent in insulation properties, heat resistance, low warping, low elasticity and adhesion with the substrate, when used as an ink for screen printing, and with which clogging of the screen, bleeding, blur, chipping and the like are unlikely to occur even when the screen printing is repeatedly carried out, so that which has an excellent ease of handling in printing. The ink composition comprises 100 parts by weight of an organic solvent-soluble polyimide block copolymer(s), and 1 to 100 parts by weight of a photoacid generator(s). The polyimide block copolymer(s) and the photoacid generator(s) are dissolved in an organic solvent. The polyimide block copolymer(s) contain(s) in its molecular skeleton a diamine having a siloxane bond, and an aromatic diamine having a hydroxyl group(s) and/or carboxyl group(s) at ortho-position with respect to an amino group.

7 Claims, No Drawings

PHOTOSENSITIVE INK COMPOSITION FOR SCREEN PRINTING AND METHOD OF FORMING POSITIVE RELIEF PATTERN WITH USE THEREOF

This application is a Continuation of application Ser. No. 12/224,593 filed on Oct. 14, 2008 now abandoned, and for which priority is claimed under 35 U.S.C. §120, wherein application Ser. No. 12/224,593 is a National Stage entry of International PCT/JP 2007/054007 filed Mar. 2, 2007; and this application claims priority of Application No. 2006-057273 filed in Japan on Mar. 3, 2006 under 35 U.S.C. §119; the entire contents of all are hereby incorporated by reference.

TECHNICAL FIELD

The present invention relates to a photosensitive ink composition for screen printing and method of forming positive-type relief pattern using the same.

BACKGROUND ART

Flexible printed circuit boards such as FPC, TAB and COF are conventionally manufactured as follows: First, a laminate in which a desired circuit pattern is formed is produced by laminating a photosensitive film or coating and drying a photosensitive resin on "polyimide film/adhesive/copper foil", and exposing and developing the resultant. Thereafter, an insulative protective film (coverlay film) is coated or a thermosetting paste is coated and cured on the surface of the copper circuit pattern formed.

However, as a printed circuit meeting the recent demands of compaction and weight saving of electronic devices, flexible printed circuit boards are attracting attention and their use is now being widened. Especially, with the compaction and densification of packaging by increasing the number of pins in semiconductor packages, thinning the lines constituting the circuits is strongly demanded. Further, in addition to the flexibility which is the intrinsic property of the flexible printed circuit boards, suppleness is now demanded as a new characteristic, and as the resin constituting the paste, polyimide resins, polyamideimide resins and polyamide resins are now used in addition to the conventionally used epoxy resins. However, these resins used in the paste have a rigid structure, and there are problems in that in cases where they are applied to a thin substrate, the substrate after curing largely warps, and the cured film lacks suppleness and has poor flexibility.

The conventional flexible printed circuit boards protected by an insulative protective film (coverlay film) are generally produced by first forming holes at desired sites in the coverlay film made of a polyimide film or the like having an adhesive on one side thereof, and the holed coverlay film are laminated on a flexible printed circuit board by thermal lamination or pressing. To protect the circuits, the surface of the flexible printed circuit boards is usually covered with a polyester resin film, polyimide resin film or the like. However, in cases of thin circuits wherein the width of the wiring is 80 μm or less, and the intervals between wirings are 80 μm or less, it is difficult to completely embed an adhesive in the irregularities between the wirings.

With the progress of miniaturization of the wiring in the flexible printed circuit boards, the method in which the coverlay film after forming the holes at the terminals of the circuit or the joint portions with other parts is subjected to positioning with the flexible circuit board (FCCL) having a formed circuit pattern has problems in that the method has a limited ease of handling and a limited positioning precision, and the production yield is low.

There is a second method wherein the holes are formed only at the prescribed positions in the coverlay film by laser etching, plasma etching or the like, after heat pressing a coverlay film made of a polyimide film or the like having an adhesive on one side thereof with a flexible circuit board. By this method, although the positioning precision is very high, there is a drawback in that holing is time-consuming and the costs of apparatus and running thereof are high.

For solving these problems, a method wherein a photosensitive resin composition is used as the coverlay film which is subjected to lamination; a method wherein a polyimide ink is directly applied by screen printing; and a method wherein a photosensitive coverlay film prepared from a photosensitive resin composition for photoresists is used; are known.

Various pastes using a polyimide resin which is made flexible and of which elastic modulus is decreased have been proposed. However, as a solvent for preparing a varnish or paste, a high boiling nitrogen-containing solvent such as N-methyl-2-pyrrolidone is used, so that curing at a high temperature of not lower than 200° C. is required, which brings about a problem that thermal deterioration of electronic parts occurs. Further, there in also a problem in that in cases where the paste after being coated on a substrate is left to stand for a long time, whitening of the coated film due to moisture absorption and formation of voids occur, and the handling conditions are complicated.

As a method for screen printing with a polyimide ink, a method is known wherein a solution of a partially imidized polyamic acid at a high concentration is coated on a substrate through a template, and the coated film on the substrate is completely imidized (Patent Literature 1). It is necessary to heat the formed coated film at a high temperature of 240° C. to 350° C. In the imidization reaction, the fact that the shrinkage of the formed polyimide resin is large is a big problem in processability, and especially, it is difficult to mold the resin as a protective layer with a precise pattern on a semiconductor wafer or the like. Further, since the solvent used in the ink is NMP, DMF or the like with a high moisture absorption, problems that the polyamic acid is likely to precipitate due to the moisture absorption by the varnish, that whitening occurs in printing, that clogging of the screen occurs, and so on occur, so that continuous printing is difficult.

For solving these problems, polyimide siloxane pastes are disclosed in, for example, Patent Literatures 1 and 2, as a paste using a resin soluble in non-nitrogen-containing polar solvents, which gives a coating with a low warping and flexibility. For decreasing the elastic modulus, expensive diamines having dimethylsiloxane bonds are used as the starting material, which is disadvantageous from the viewpoint of economy. Further, there are problems in that with the increase in the amount of the modifying siloxane, the adhesiveness with the sealing material, solvent resistance and chemical resistance (solder flux resistance), as well as PCT (Pressure Cooker Treatment) resistance are degraded.

Further, Patent Literatures 3 and 4 disclose a solution composition of a soluble polyimide siloxane and epoxy resin. Since the polyimide is solvent-soluble, there is a problem in that the composition has a poor chemical resistance. In addition, there are practical problems in that the composition is likely to dry during screen printing, and as a result, clogging of the screen mesh occurs so that the formation of a pattern becomes very difficult. Further, Patent Literature 5 discloses a soluble polyimide composition containing a diamine having 10 mol % of dimethylsiloxane bonds. Although the coating film after drying made from this composition is excellent in chemical resistance, heat resistance and in adhesiveness with substrates and adhesive sheets, improvements in flexibility and in anti-warping are demanded. On the other hand, Patent Literature 6 discloses in Examples 1 and 2 thereof a soluble polyimide composition using a diamine having 33 mol % of dimethylsiloxane bonds, and in Example 4, a soluble polyimide composition using a diamine having 50 mol % of dimethylsiloxane bonds. The coating films after drying made from these compositions are excellent in the low warping, chemical resistance, heat resistance, flexibility and adhesiveness with substrates and adhesive sheets. However, the compositions are especially poor in ease of handling in printing, when viewed from the point of developing the use as an ink for printing.

As a method for forming a pattern of polyimide coating films for photoresists, the so called photosensitive polyimide method is known wherein a polyamic acid precursor is coated on a substrate; the coated film is exposed and developed to dissolve the exposed regions (positive-type) or the non-exposed regions (negative-type); and the remaining polyamic acid is imidized. However, it is necessary to heat the coated film at a temperature as high as 240° C. to 350° C.

On the other hand, as the polyimide compositions for this use, those containing a polyamic acid and a compound having carbon-carbon double bond which can be dimerized or polymerized by a chemical ray and an amino group, or a quaternary salt thereof (Patent Literature 7); and the compositions containing a polyamic acid and an acrylamides (Patent Literature 8) are known.

Compositions containing a polyimide precursor having carbon-carbon double bond-containing groups, a specific oxime compound and a sensitizer are also known as a representative composition (see Patent Literatures 9 to 5). These compositions have negative photosensitivity wherein the exposed regions remain after developing, and receive reasonable evaluation and are used in practice.

For attaining the above-described object, a photosensitive polyimide composition was proposed (see Patent Literature 12) which comprises a polyimide and a photoinitiator, characterized by comprising a polyimide having carboxyl groups in the side chains, which polyimide is obtained by imidization reaction between one or more acid dianhydrides and one or more diamines, and by further comprising an aminoacrylamide compound as a reaction component to be reacted with the above-mentioned carboxyl groups. Patent Literature 12 also discloses a soluble polyimide in which a diamine containing 1 to 10 mol % of dimethylsiloxane bonds. However, the polyimide is obtained by reacting the acid dianhydride and the diamine in the presence of a catalyst in an organic polar solvent containing as a major component N-methyl-2-pyrrolidone, N,N-dimethylacetamide, N,N-dimethylformamide or the like, and they have problems of whitening in printing, clogging of the screen sheet and so on, so that the compositions are especially poor in ease of handling in printing, when viewed from the point of developing the use as an ink for printing.

The present applicant previously filed a patent application (Patent Literature 13) directed to a photosensitive resin composition containing a polyimide block copolymer. However, Patent Literature 13 does not disclose or suggest a photosensitive resin composition which exhibits excellent properties when used as a ink for screen printing.

Patent Literature 1: JP 7-304950 A
Patent Literature 2: JP 8-333455 A
Patent Literature 3: JP 4-298093 A
Patent Literature 4: JP 6-157875 A
Patent Literature 5: JP 2003-113338 A
Patent Literature 6: JP 2003-119285 A
Patent Literature 7: JP 59-52822 B
Patent Literature 8: JP 3-170555 A
Patent Literature 9: JP 61-118423 A
Patent Literature 10: JP 62-184056 A
Patent Literature 11: JP 62-273259 A
Patent Literature 12: JP 2003-345007 A
Patent Literature 13: WO 99/19771

DISCLOSURE OF THE INVENTION

Problems to be Solved by the Invention

An object of the present invention is to provide a photosensitive ink which can form a coated film that is excellent in insulation properties, heat resistance, low warping, low elasticity and adhesion with the substrate, when used as an ink for screen printing, and with which clogging of the screen, bleeding, blur, chipping and the like are unlikely to occur even when the screen printing is repeatedly carried out, so that which has an excellent ease of handling in printing.

Means for Solving the Problems

The present inventors intensively studied to discover that a photosensitive polyimide resin composition comprising a photosensitive polyimide block copolymer containing in its molecular skeleton a diamine having a siloxane bond(s), and an aromatic diamine having a hydroxyl group(s) and/or carboxyl group(s) at ortho-position with respect to an amino group exhibits an excellent ease of handling in printing when used as an ink for screen printing, thereby completing the present invention.

That is, the present invention provides a photosensitive ink composition for screen printing, the ink composition comprising 100 parts by weight of an organic solvent-soluble polyimide block copolymer(s), and 1 to 100 parts by weight of a photoacid generator(s), the polyimide block copolymer(s) and the photoacid generator(s) being dissolved in an organic solvent, the polyimide block copolymer(s) containing in its molecular skeleton a diamine having a siloxane bond(s), and an aromatic diamine having a hydroxyl group(s) and/or carboxyl group(s) at ortho-position with respect to an amino group. The present invention also provides a method for forming a positive-type relief pattern, the method comprising coating the composition according to the present invention on a substrate; radiating an active light source in the form of the pattern; and developing the irradiated regions with an alkaline developer.

By the present invention, a photosensitive ink was provided which can form a coated film that is excellent in insulation properties, heat resistance, low warping, low elasticity and adhesion with the substrate, when used as an ink for screen printing, and with which clogging of the screen, bleeding, blur, chipping and the like are unlikely to occur even when the screen printing is repeatedly carried out, so that which has an excellent ease of handling in printing.

Best Mode for Carrying Out the Invention

As described above, the polyimide block copolymer(s) used as the resin component(s) in the photosensitive ink composition for screen printing according to the present invention contains in its molecular skeleton (that is, in its main chain) a diamine(s) having a siloxane bond(s) (hereinafter also referred to as "siloxane bond-containing diamine") as a part of the diamine components. It should be noted that the term "contain a diamine" herein means to contain a unit originated from the diamine, which unit is obtained by polycondensing the diamine with a tetracarboxylic dianhydride. In the polyimide block copolymer, needless to say, the amino groups in the diamine are subjected to the imide bonds.

Preferred examples of the siloxane bond-containing diamine include the diamines having the structure represented by any one of the following Formulae (I) to (IV). wherein in Formula (I), $R_1$, $R_2$, $R_3$ and $R_4$ each independently represent an alkyl group, cycloalkyl group, phenyl group or a phenyl group substituted by 1 to 3 alkyl groups or by 1 to 3 alkoxyl groups; 1 and m each independently represent an integer of 1 to 4; and n represents an integer of 3 to 30.

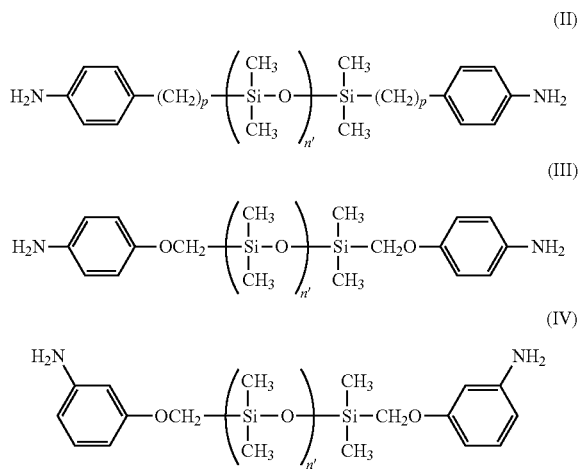

wherein in Formulae (II) to (IV), n' represents an integer of 1 to 30; and p in Formula (II) represents an integer of 1 to 4.

In the above-described Formula (I), $R_1$, $R_2$, $R_3$ and $R_4$ each independently are preferably $C_1$-$C_6$ alkyl group, $C_3$-$C_7$ cycloalkyl group, phenyl group, or phenyl group substituted with 1 to 3 $C_1$-$C_6$ alkyl groups or with 1 to 3 $C_1$-$C_6$ alkoxyl groups. Especially preferred examples include methyl group, ether group, propyl group, isopropyl group, butyl group, isobutyl group, pentyl group, hexyl group, cyclohexyl group, phenyl group, tolyl group, xylyl group, ethoxy group, ethylphenyl group, propylphenyl group and the like.

The siloxane bond-containing diamines may be used individually and a mixture of two or more of them may also be used. As the siloxane bond-containing diamines, commercially available diamines may be used. For examples, those sold by Shin-etsu Chemical Co., Ltd., Dow Corning Toray Co., Ltd. and Chisso Corporation may be used as they are. Specific examples include KF-8010 (amino equivalent: about 450; in Formula (I); $R_1$, $R_2$, $R_3$ and $R_4$ are methyl; 1 and m are 3) produced by Shin-etsu Chemical Co., Ltd.; X-22-161A (amino equivalent: about 840; in Formula (I), $R_1$, $R_2$, $R_3$ and $R_4$ are methyl; 1 and m are 3); BY16-853U (amino equivalent: about 460; $R_1$, $R_2$, $R_3$ and $R_4$ are methyl; 1 and m are 3) produced by Dow Corning Toray; diaminosiloxane compound X-22-9415 (amino equivalent: about 1000; in Formula (I); $R_1$, $R_2$, $R_3$ and $R_4$ are methyl; 1 and m are 3) produced by Shin-etsu Chemical Co., Ltd.; diaminosiloxane compound X-22-9409 (amino equivalent: about 680; in Formula (I); $R_1$, $R_2$, $R_3$ and $R_4$ are methyl or phenyl; 1 and m are 3) produced by Shin-etsu Chemical Co., Ltd.

The content of the above-described siloxane bond-containing diamine(s) (in cases where two or more siloxane bond-containing diamines are contained, the total content) in the polyimide block copolymer is not restricted, and is preferably 15 to 85% by weight, more preferably 35 to 80% by weight, based on the total diamine components in the polyimide block copolymer. If the content of the siloxane bond-containing diamine(s) is less than 15% by weight, the elongation of the coated film of the polyimide ink for screen printing is poor, and sufficient flexibility is unlikely to be obtained. Further, warping of the substrate, decrease in suppleness (flexibility) and decrease in adhesion are likely to occur, so that it is not preferred. If the content of the siloxane bond-containing diamine units exceeds 85% by weight, the heat resistance tends to be deteriorated, which is not preferred.

The polyimide block copolymer(s) used as the resin component also contain(s) as a part of the diamine components an aromatic diamine having a hydroxyl group(s) and/or carboxyl group(s) at ortho-position with respect to an amino group (hereinafter referred to as "hydroxyl group/carboxyl group-containing diamine"). Although those having hydroxyl group(s) and/or carboxyl group(s) at ortho-position with respect to each of the two amino groups are preferred, it is acceptable that the diamine has the hydroxyl group and/or carboxyl group at ortho-position with respect to one of the amino groups. As the hydroxyl group/carboxyl group-containing diamine, diamines containing two benzene rings to which the amino groups and the hydroxyl group(s) and/or the carboxyl group(s) are bound are preferred.

Preferred examples of hydroxyl group/carboxyl group-containing diamine include 2,2-bis(3-amino-4-hydroxyphenyl)propane, 1-hydroxy-2,4-diaminobenzene, 3,3'-dihydroxybenzidine, 3,3'-dihydroxy-4,4'-diaminodiphenylether, 1,4-bis-(3-hydroxy-4-aminophenoxy)benzene, 2,2-bis(4-amino-3-hydroxyphenyl)propane, 2,2-bis(3-amino-4-hydroxyphenyl)hexafluoropropane, bis(3-amino-4-hydroxyphenyl)sulfone, bis(3-amino-4-hydroxyphenyl)sulfide, 3,3'-dicarboxy-4,4'-diaminodiphenylmethane and 3,5-diaminobenzoic acid. The hydroxyl group/carboxyl group-containing diamines may be employed individually or two or more of them may be employed in combination.

The content of the above-described hydroxyl group/carboxyl group-containing diamine(s) (in cases where two or more hydroxyl group/carboxyl group-containing diamines are contained, the total content) in the polyimide block copolymer is not restricted, and is preferably 5 to 20% by weight, more preferably 7 to 15% by weight, based on the total diamine components in the polyimide block copolymer. If the content of the hydroxyl group/carboxyl group-containing diamine(s) is less than 5% by weight, the photosensitivity tends to be decreased, and if it is more than 20% by weight, film loss or the like tends to occur.

The polyimide block copolymer(s) may contain one or more diamines as the diamine components, in addition to the above-described siloxane bond-containing diamine(s) and hydroxyl group/carboxyl group-containing diamine(s). Examples of such an aromatic diamine include 9,9'-bis(4-aminophenyl)fluorene, m-phenylenediamine, p-phenylenediamine, 2,4-diaminotoluene, 4,4'-diamino-3,3'-dimethyl-1,1'-biphenyl, 3,4'-diaminodiphenylether, 4,4'-diaminodiphenylether, 3,3'-diaminodiphenyl sulfone, 4,4'-diaminodiphenyl sulfone, 4,4'-diaminodiphenyl sulfide, 2,2-bis(4-aminophenyl)propane, 2,2-bis(4-aminophenyl)hexafluoropropane, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, 2,2-bis[4-(4-aminophenoxy)phenyl]propane, 2,2-bis[4-(4- aminophenoxy)phenyl]hexafluoropropane, bis[4-(3-aminophenoxy)phenyl]sulfone, bis[4-(4-aminophenoxy)phenyl]sulfone, 2,6-diaminopyridine, 2,6-diamino-4-methylpyridine, α, α-bis(4-aminophenyl)-1,3-diisopropylbenzene, α, α-bis(4-aminophenyl)-1,4-diisopropylbenzene and the like.

On the other hand, as the tetracarboxylic dianhydride component(s), an aromatic tetracarboxylic dianhydride(s) is(are) used from the viewpoint of heat resistance of the polyimide and compatibility with the siloxane bond-containing diamine(s). Examples thereof include pyromellitic dianhydride, 3,3',4,4'-biphenyltetracarboxylic dianhydride, bis(3,4-dicarboxyphenyl)ether dianhydride, 3,3',4,4'-benzophenonetetracarboxylic dianhydride, bicyclo[2.2.2]oct-7-ene-2,3,5,6-tetracarboxylic dianhydride, 2,2-bis(3,4-dicarboxyphenyl) hexafluoropropane dianhydride, 3,3',4,4'-biphenylsulfone tetracarboxylic dianhydride, p-phenylenebis (trimellitic monoester anhydride), ethylene glycol-bis-trimellitic anhydride ester and the like. Among these, from the viewpoint of heat resistance of the polyimide, adhesion of conductor lines, compatibility with the siloxane bond-containing diamine(s) and of polymerization rate, 3,3',4,4'-biphenyltetracarboxylic dianhydride, p-phenylene bis(trimellitic acid monoester acid anhydride), ethylene glycol bis-trimellitic anhydride ester), bis(3,4-dicarboxyphenyl) ether dianhydride, 3,3',4,4'-benzophenone tetracarboxylic dianhydride, 3,3',4,4'-biphenyl sulfone tetracarboxylic dianhydride and the like are especially preferred. These exemplified tetracarboxylic dianhydrides may be employed individually or two or more of them may be employed in combination.

Although the polyimide block copolymer may contain 3 or more blocks, since the production process is complicated and the cost is high, the polyimide block copolymer is preferably composed of 2 blocks.

Although the above-described siloxane bond-containing diamine(s) may be contained in two or more blocks in the polyimide block copolymer, the siloxane bond-containing diamine(s) is preferably contained in only one block from the viewpoint of ease of handling in printing. In this case, the diamine component(s) in the block may contain one or two siloxane bond-containing diamines only, or may also contain one or more hydroxyl group/carboxyl group-containing diamines and/or the above-described one or more other diamines. The hydroxyl group/carboxyl group-containing diamine(s) may be contained in two or more blocks, or may be contained in only one block. In cases where one or more hydroxyl group/carboxyl group-containing diamines are contained in one block, it(they) may be contained in the same block as that containing the siloxane bond-containing diamine(s), or in another block. In cases where the hydroxyl group/carboxyl group-containing diamine(s) is(are) contained in another block, the block may contain only the one or more hydroxyl group/carboxyl group-containing diamine(s).

Such a polyimide block copolymer is preferably one produced by a polycondensation process comprising at least two steps of polycondensation, including a first polycondensation step of dehydration-condensing one or more tetracarboxylic dianhydrides with one or more diamines in the presence of a binary catalyst containing a lactone and a base; and a second polycondensation step of dehydration-condensing the polyimide obtained in the first polycondensation step with one or more tetracarboxylic dianhydrides and one or more diamines in the presence of a binary catalyst containing a lactone and a base.

The two-step polycondensation process may preferably be carried out by first polycondensing one or more tetracarboxylic dianhydrides with one or more hydroxyl group/carboxyl group-containing diamines together with the above-described siloxane bond-containing diamine(s) in the presence of an acid catalyst in an organic polar solvent at 150° C. to 220° C. to obtain a polyimide oligomer; and then polycondensing the thus obtained oligomer with tetracarboxylic dianhydride(s) and/or a diamine(s) not containing a siloxane bond in its molecular skeleton to extend the chain. The above-described first step and the second step may be carried out in the reverse order. Further, as described above, one or more siloxane bond-containing diamines alone may be added as the diamine component(s), or one or more of the siloxane bond-containing diamines and one or more of the above-described other diamines may be added. Still further, one or more of the hydroxyl group/carboxyl group-containing diamines may be added in either step or may be added in both steps. The molar ratio of the diamine(s) to the tetracarboxylic dianhydride(s) in the first step is preferably 0.5 to 2.0, and the molar ratio of the total diamine(s) to the total tetracarboxylic dianhydride(s) is preferably 0.95 to 1.05, more preferably 0.98 to 1.02.

By the process employing such a two-step polycondensation process, the random copolymerization due to the exchange reaction between the amic acids is prevented to yield a block copolymer, so that a higher solubility and adhesiveness of the polyimide may be given, and the electrical and mechanical properties may be improved, when compared with the process wherein three or more components are mixed to yield a random copolymer.

As the reaction catalyst, a one-component base catalyst or a mixed catalyst containing a lactone or acidic compound and a base may be employed. Examples of the one-component base catalyst include tertiary amines such as triethylamine and tributylamine; pyridine derivatives such as pyridine, 2-picoline, 2,3-lutidine; 1,4-dimethylpiperazine; N-methylmorpholine and the like. As the mixed catalyst, mixtures of a lactone such as β-butyrolactone or γ-butyrolactone, or an acidic compound such as crotonic acid or oxalic acid, and the above-described basic compound(s) may be exemplified. The mixing ratio of the acid to the base in the acid-base catalyst is 1:1 to 1:5 (molar equivalent), preferably 1:1 to 1:2. Preferred catalysts are binary composite catalysts constituted by a lactone or crotonic acid and a base. As the lactone, γ-valerolactone is preferred, and as the base, pyridine and N-methylmorpholine are preferred. The mixing ratio of the lactone or crotonic acid to the base is 1:1 to 1:5 (molar equivalent), preferably 1:1 to 1:2. In the presence of water, it shows a catalytic activity as an acid-base double salt, and upon elimination of water from the reaction system (preferably, the polycondensation reaction is carried out in the presence of toluene, and the generated water is eliminated from the reaction system together with toluene) after completion of imidization, it loses the catalytic activity. The amount of the one-component or the mixed catalyst based on the total tetracarboxylic dianhydrides (the total of the first and second steps) is 1/100 to 1/5 by mole, preferably 1/50 to 1/10 by mole.

As the solvent used for the polymerization reaction, an organic solvent, preferably an organic polar solvent is used. Preferred examples of the organic polar solvent include lactone solvents such as γ-butyrolactone; benzoic acid ester solvents; and ether solvents; and the solvent is preferably used as it is as the solvent of the ink composition of the present invention. In view of the drying, clogging and the like of the screen sheet, it is preferred to use a solvent having a vapor pressure of not higher than 3 mmHg, more preferably not higher than 1 mmHg at room temperature. Preferred examples of the benzoic acid ester solvents include methyl benzoate, ethyl benzoate and butyl benzoate; and preferred examples of the ether solvents include triethylene glycol dimethyl ether, tetraethylene glycol dimethyl ether and the like. To eliminate the water generated by dehydration and imidization, it is preferred to use a solvent which can be azeotropically distilled off together with water. Examples of such solvents are aromatic compounds including benzene; alkylbenzenes such as toluene and xylene; and alkoxybenzenes such as methoxybenzene. As for the reaction conditions in the first step, the temperature is 150° C. to 220° C. and the reaction time is not restricted, and usually about 0.5 to 3 hours. The generated water is preferably eliminated from the system continuously by azeotropic distillation.

When the amount of the generated water reaches the theoretical amount and the water is no longer eliminated from the system, the reaction mixture is cooled and one or more tetracarboxylic dianhydrides and/or one or more diamines are added to start the second step reaction. As the tetracarboxylic dianhydride(s) and the diamine(s) used, those exemplified above may also be employed here. These may or may not be same as those used in the first step. However, in a preferred mode, at least the diamine component(s) is(are) not the same as the diamine component(s) used in the first step (although the diamine components may contain the diamine component(s) used in the first step, the diamine components include a different diamine component(s)). Although details are described in Examples, prescribed amounts of tetracarboxylic dianhydride(s), diamine compound(s) and a solvent are added, and the reaction is allowed to occur at 150° C. to 220° C. as in the first step. The generated water is continuously eliminated from the system by azeotropic distillation. When water is no longer generated, water is completely distilled off. Unless the water is completely distilled at this point, it evaporates during printing to cause change in viscosity, pollution of the environmental atmosphere or the like, which is not preferred. The reaction time is not restricted and usually about 3 hours to 8 hours. However, since the polymerization reaction can be monitored by the measurement of viscosity and/or by GPC, the reaction is usually continued until the prescribed viscosity and molecular weight are attained. The weight average molecular weight of the polyimide is preferably 20,000 to 200,000, more preferably 30,000 to 50,000. An acid anhydride such as phthalic anhydride or an aromatic amine such as aniline may be added as a terminator.

By the process described above, the polyimide block copolymer can be obtained. The solid content at this point is preferably 10 to 50% by weight, more preferably 20 to 35% by weight. For the purpose of adjusting viscosity, a ketone solvent may be used in addition to the lactone solvent, benzoic acid solvent or ether solvent used in the synthesis. Examples of ketone solvent include methyl ethyl ketone, methyl propyl ketone, methyl isopropyl ketone, methyl butyl ketone, methyl isobutyl ketone, methyl n-hexyl ketone, diethyl ketone, diisopropyl ketone, diisobutyl ketone, cyclopentanone, cyclohexanone, methylcyclohexanone, acetylacetone, diacetone alcohol, cyclohexen-1-one and the like.

The polyimide block copolymers thus obtained usually have the following properties:
1) Thermal Properties
    Glass Transition Temperature: 100° C. to 280° C. (TG-TDA method)
    Thermal Decomposition Initiation Temperature: 300° C. to 550° C. (TG-TDA method)
2) Electrical Properties
    Volume Resistivity: 1015 ohms or more (JIS-C6471 7.1)
    Dielectric Constant: 2.5-2.9 (JIS-C6471 7.5)
3) Mechanical Properties
    Tensile Strength: 10-100 N/mm$^2$ (JIS-C2330)
    Tensile Elongation: 30-500% (JIS-C2330)
    Tensile Elastic Modulus: 80-1000 N/mm$^2$ (JIS-C2330)
4) Chemical Properties
    Water Absorption: 0.01-1%
    Resistance to Soldering Heat: 260° C., 60 seconds or more (JIS-C6471 9.3)
    Alkali Resistance: The weight loss after being immersed in 5% caustic soda for 30 minutes is 1% or less.

The ink composition of the present invention comprises a photoacid generator in addition to the above-described polyimide block copolymer. A photoacid generator is a compound which generates an acid upon being irradiated with light, and various photoacid generators are commercially available. Preferred examples of the photoacid generator include naphthoquinone diazide photoacid generators and oxonaphthalene diazide photoacid generators. The naphthoquinone diazide photoacid generators are diazide compounds having naphthoquinone skeleton, which generate an acid upon being irradiated with light. Preferred examples of naphthoquinone diazide photoacid generator include esters of 1,2-naphthoquinon-2-diazido-5-sulfonic acid and 1,2-naphthoquinon-2-diazido-4-sulfonic acid, the counterparts of the esters being low molecular aromatic hydroxyl compounds such as 2,3,4-trihydroxybenzophenone, 1,3,5-trihydroxybenzene, 2- and 4-methyl phenol and 4,4'-hydroxy-propane. Oxonaphthalene diazide photoacid generators are diazide compounds having oxonaphthalene skeleton, which generate an acid upon being irradiated with light. Preferred examples of oxonaphthalene diazide photoacid generator include esters of 6-diazo-5,6-dihydro-5-oxo-naphthalen-1-sulfonic acid, the counterparts of the esters being low molecular aromatic hydroxyl compounds such as 2,3,4-trihydroxybenzophenone, 1,3,5-trihydroxybenzene, 2- and 4-methyl phenol, 4,4'-hydroxy-propane. The photoacid generator may be added immediately before use of the ink composition. The photosensitive ink composition for screen printing according to the present invention may be obtained by adding the photoacid generator, and if necessary, a solvent and an additive(s) to the polyimide block copolymer obtained by the process described above without removing the solvent.

The content of the naphthoquinone diazide photoacid generator is 1 to 100 parts by weight, preferably 2 to 30 parts by weight based on 100 parts by weight of the polyimide block copolymer. If the content is outside this range, the sensitivity is decreased, or the restrictions concerning development are increased.

It is preferred to add a sensitizer such as Michler's ketone, 4,4'-diethylaminozenzophenone, 3,3'-carbonylbis(diethylaminocoumarin) or the like to the composition of the present invention. The amount of addition is 0.1 to 20% by weight, preferably 0.2 to 10% by weight based on the polyimide block copolymer.

The composition of the present invention forms positive-type images by development, after being irradiated with light, with an alkaline developer, preferably containing (1) sodium carbonate (1.5 to 5.0% by weight) or (2) sodium hydroxide (1.5 to 4.0% by weight) and aminoalcohol (0.1 to 3.0% by weight).

Usually, positive-type images are formed by adding a photoacid generator to a novolak resin, irradiation with light and subsequent development with an aqueous alkaline solution. In this case, the novolak resin has a low molecular weight of not more than 10,000, and it is said that the solubility in the aqueous alkaline solution is increased by interactions-hydrogen bond between the hydroxyl groups and the carboxylic acid in the photoacid generator.

To use the polyimide block copolymer as an insulating film, the polyimide block copolymer has a large molecular weight, that is, a weight average molecular weight of not less than 20,000 in terms of polystyrene, as described above. If the weight average molecular weight is not more than 20,000, a tough insulating film is not formed. Large molecular polymers are not dissolved in alkaline solutions easily. The solubility of the above-described polyimide block copolymer is increased by the light irradiation in the presence of the photoacid generator by virtue of interaction between the hydroxyl groups or the carboxyl groups therein and the indene carboxylic acid generated in the exposed regions by the light irradiation, thereby forming positive-type images.

The photosensitive ink composition of the present invention is used as follows: First, the composition is coated on, for example, silicon wafer, copper substrate, metal substrate, ceramics substrate, overcoat material, rigid substrate, flexible circuit board such as FPC, TAB or COF, semiconductor element or various electronic parts such as multilayer circuit board or multilayer circuit built-in film substrate by screen printing. Screen printing is a well-known printing method, wherein the printing is carried out by passing an ink through a screen in which a pattern is formed, with a squeegee or the like.

Then the coated film is dried by prebaking at a low temperature, preferably at 50° C. to 100° C., and then a chemical ray is selectively radiated in a desired pattern shape. As the chemical ray, X-ray, electron beam, UV, visible light or the like may be used, and those having a wavelength of 200 nm to 500 nm are preferred. Then the irradiated regions are dissolved with the developer and removed to obtain a relief pattern. After the development, by evaporating most of the solvent in the non-exposed regions by heating at a temperature not higher than 220° C., a coated film can be converted to one made of the polyimide resin. The thickness of the coated film is not restricted, and is preferably 4 μm to 30 μm, more preferably 6 μm to 20 μm, especially preferably 10 μm to 15 μm.

In the present invention, as the developer, an alkaline developer or an aqueous alkaline solution may be used. The alkaline developer is one obtained by dissolving a basic compound in a solvent to a concentration of not less than 30% by weight. Examples of these organic solvents include polar solvents such as N-methyl-2-pyrrolidone, N,N'-dimethylformamide, N,N'-dimethylacetamide, dimethylsulfoxide and γ-butyrolactone. Those solvents obtained by adding an ordinary organic solvent(s) including alcohols such as methanol and ethanol; aromatic hydrocarbon compounds such as toluene and xylene; ketones such as methyl ethyl ketone; ethers such as tetrahydrofuran and dioxane; and the like may also be used.

The aqueous alkaline solution is a developer obtained by dissolving a basic compound(s) in a solvent containing not less than 70% of water. Examples of the solvent other than water, which may be added in order to promote the developing rate include aprotic polar solvents such as N-methyl pyrrolidone, N,N'-dimethylformamide, N,N'-dimethylacetamide, dimethyl sulfoxide, γ-butyrolactone and the like; alcohols such as methanol, ethanol, isopropyl alcohol and the like; ketones such as acetone, methyl ethyl ketone, cyclopentanone and the like; esters such as methyl acetate, methyl lactate and the like; ethers such as tetrahydrofuran, dioxazine and the like; diols such as ethylene glycol, diethylene glycol and the like; cellosolves such as ethylene glycol monomethyl ether, propylene glycol monomethyl ether and the like.

Examples of the basic compound include hydroxides, carbonates, hydrogen carbonates, silicates, phosphates, pyrophosphates, acetates, amine salts and the like of alkaline metals or quaternary ammonium. Specific examples thereof include sodium hydroxide, lithium hydroxide, potassium hydroxide, ammonium hydroxide, trimethylbenzylammonium hydroxide, tetramethylammonium hydroxide, sodium carbonate, potassium carbonate, sodium hydrogen carbonate, sodium silicate, sodium phosphate, sodium pyrophosphate, sodium acetate, monoethanolamine, diethanolamine, triethanolamine, choline and the like, but the basic compounds are not restricted to these.

The amount of the basic compound used is usually 0.1 to 20 parts by weight, preferably 0.5 to 10 parts by weight based on 100 parts by weight of the solvent (organic solvent or water, or a mixture thereof). If the amount used is too small, the developing property is decreased and the developing time tends to be long. If it is too large, the basic compound is not completely dissolved and the solution may be non-uniform, or the surface of the non-exposed regions may be roughened because the alkali concentration is too high so that the solubilizing property to the polyimide is too high. It is preferred to use the basic compound in an amount at which the pH of the developer is usually not less than 10.0, preferably within a range between 11.0 and 13.5. If the pH of the developer is less than 10.0, the developing rate tends to be decreased, and if it is higher than 13.5, the solubilizing property to the polyimide is too high, so that swelling of the non-exposed regions, roughening of the surface of the non-exposed regions occur, and the difference in solubilites between the exposed regions and non-exposed regions is so small that it is difficult to form a pattern with good shape.

As the developing method, various methods such as spraying, paddling, immersion and ultrasonic immersion may be employed. The developing rate is also influenced by the temperature of the liquid. Therefore, it is preferred to set the best conditions preliminarily examining the various conditions such as pH and temperature of the developer, the developing method and the like.

The relief pattern formed by the development is usually washed with a rinse solution. Examples of the rinse solution include methanol, ethanol, isopropanol, water and the like. These may be used individually or in combination. As the rinse solution, water alone or mixtures of water and an alcohol are especially preferred. The amount of addition of the alcohols is usually 5 to 30 parts by weight, preferably 10 to 20 parts by weight. After rinsing, most of the solvent in the non-exposed regions is dried by heating at a temperature of not higher than 220° C. to obtain a polyimide resin pattern excelling in heat resistance and solvent resistance.

The photosensitive polyimide ink composition for printing according to the present invention has the features that the sagging and bleeding are small, when printing is carried out and the stickiness to the screen is small. However, to give better thixotropic property, a known filler or thixotropic property-giving agent may also be used. As the filler, insulative inorganic fillers, resin-coated inorganic fillers and resin fillers may be used. Examples of the insulative inorganic filler include aerosil and silica (average particle size 0.001 to 0.2 μm); and examples of the resin-coated inorganic filler include PMMA/polyethylene, silica/polyethylene and the like. Preferred examples of the resin filler include epoxy resins, polyphosphoric acid melamine, melem, melamine cyanurate, maleimide resins, polyurethane resins, polyimides, polyamides, triazine compounds and the like, in the form of particles having an average particle size of 0.05 μm to 50 μm. The filler is preferably in the form of fine particles having an average particle size of 0.001 μm to 10 μm. The amount of the filler is preferably 3 to 10 parts by weight with respect to the polyimide in an amount of 95 to 80 parts by weight.

Further, known additives such as defoaming agent and leveling agent may also be added. It is also preferred to add to the leveling agent a surfactant to a concentration of about 100 ppm to about 2% by weight. By this, foaming is inhibited and the coated film can be made flat. The surfactant is preferably non-ionic which does not contain ionic impurities. Appropriate examples of the surfactant include "FC-430" of 3M; "BYK-051" of BYK Chemi; and Y-5187, A-1310 and SS-2801 to 2805 of Nippon Unicar Co., Ltd. Appropriate examples of the antifoaming agent include "BYK-A501" of BYK Chemi; "DC-1400" of Dow Corning; silicone antifoaming agents such as SAG-30, FZ-328, FZ-2191, FZ-5609 of Nippon Unicar Co., Ltd.; and KS-603 produced by Shinetsu Chemical Co., Ltd. and the like.

EXAMPLES

The production process of the polyimide solutions used in the present invention and their characteristics will now be described concretely by way of examples. Since polyimides having various properties can be obtained depending on the combination of the acid dianhydrides and the diamines, the present invention is not restricted to these Examples.

Synthesis Example 1

To a three-necked separable flask equipped with a stainless steel anchor agitator, and a condenser comprising a trap for water separation and a cooling tube having balls are attached. Bis-(3,4-dicarboxyphenyl)etherdiacid dianhydride (hereinafter referred to as "OPDA" for short) in an amount of 93.07 g (300 millimoles), 136.80 g (150 millimoles) of diaminosiloxane compound BY16-853U (amino equivalent: 456) produced by Dow Corning Toray, 14.02 g (50 millimoles) of 3,3'-diamino-4,4'-dihydroxydiphenylsulfone (hereinafter referred to as "ABPS" for short), 4.00 g (40 millimoles) of γ-valerolactone, 6.33 g (80 millimoles) of pyridine, 259 g of γ-butyrolactone, 173 g of methyl benzoate and 40 g of toluene are added. After stirring the mixture at 180 rpm at room temperature under nitrogen atmosphere for 30 minutes, the mixture was heated to 180° C. and stirred for another 2 hours. During the reaction, toluene-water azeotrope was removed.

After cooling the mixture to room temperature, 31.02 g (100 millimoles) of ODPA, 35.07 g (120 millimoles) of 1,3-bis(3-aminophenoxy)benzene (hereinafter referred to as "APB" for short), 22.42 g (80 millimoles) of ABPS, 95 g of γ-butyrolactone, 63 g of methyl benzoate and 40 g of toluene were added, and the resulting mixture was stirred at 180° C. at 180 rpm for 5 hours. The refluxed materials were removed to obtain a polyimide solution having a concentration of 35%. The molecular weight of the thus obtained polyimide was measured with an apparatus (produced by Tosoh). As a result, the polyimide had a number average molecular weight (Mn) of 19,000, weight average molecular weight (Mw) of 38,000, Z average molecular weight (Mz) of 51,000 and Mw/Mn of 1.9, the molecular weights being in terms of polystyrene. This polyimide was poured into methanol to convert it to powders which were subjected to thermal analysis. The glass transition temperature (Tg) was 169.5° C. and the thermal decomposition initiation temperature was 430.1° C.

Synthesis Example 2

A mixture of 62.04 g (200 millimoles) of ODPA, 160.00 g (100 millimoles) of X-22-161A (amino equivalent: 800), 3.00 g (30 millimoles) of γ-valerolactone, 4.75 g (60 millimoles) of pyridine, 301 g of γ-butyrolactone, 201 g of methyl benzoate and 60 g of toluene was stirred at 180 rpm at room temperature under nitrogen atmosphere for 30 minutes, and the mixture was heated to 180° C., followed by stirring the mixture for another 2 hours. During the reaction, toluene-water azeotrope was removed.

After cooling the mixture to room temperature, 31.02 g (100 millimoles) of ODPA, 24.83 g (100 millimoles) of 4,4'-diaminodiphenylsulfone (hereinafter referred to as "pDDS" for short), 28.03 g (100 millimoles) of ABPS, 112 g of γ-butyrolactone, 75 g of methyl benzoate and 40 g of toluene were added, and the resulting mixture was stirred at 180° C. at 180 rpm for 5 hours. The refluxed materials were removed to obtain a polyimide solution having a concentration of 30%. The molecular weight, glass transition temperature and thermal decomposition initiation temperature thereof were measured.

Synthesis Example 3

A mixture of 58.84 g (200 millimoles) of 3,3',4,4'-biphenyltetracarboxylic dianhydride (hereinafter referred to as "BPDA" for short), 91.20 g (100 millimoles) of BY16-853U (amino equivalent: 456), 3.00 g (30.0 millimoles) of γ-valerolactone, 4.75 g (60 millimoles) of pyridine, 200 g of γ-butyrolactone, 133 g of methyl benzoate and 60 g of toluene are added. After stirring the mixture at 180 rpm at room temperature under nitrogen atmosphere for 30 minutes, the mixture was heated to 180° C., followed by stirring the mixture for another 2 hours. During the reaction, toluene-water azeotrope was removed.

After cooling the mixture to room temperature, 31.02 g (100 millimoles) of ODPA, 28.63 g (100 millimoles) of 3,3'-dicarboxy-4,4'-diaminodiphenylmethane (hereinafter referred to as "MBAA" for short), 29.23 g (100 millimoles) of APB, 119 g of γ-butyrolactone, 80 g of methyl benzoate and 60 g of toluene were added, and the resulting mixture was stirred at 180° C. at 180 rpm for 5 hours. The refluxed materials were removed from the system to obtain a polyimide solution having a concentration of 30%. The molecular weight, glass transition temperature and thermal decomposition initiation temperature thereof were measured.

Synthesis Example 4

A mixture of 46.53 g (150 millimoles) of ODPA, 80.00 g (50 millimoles) of X-22-161A (amino equivalent: 800), 7.01 g (25 millimoles) of APBS, 2.00 g (20 millimoles) of γ-valerolactone, 3.16 g (40 millimoles) of pyridine, 179 g of γ-butyrolactone, 120 g of methyl benzoate and 60 g of toluene was stirred at 180 rpm at room temperature under nitrogen atmosphere for 30 minutes, and the mixture was heated to 180° C., followed by stirring the mixture for another 2 hours. During the reaction, toluene-water azeotrope was removed.

After cooling the mixture to room temperature, 15.51 g (50 millimoles) of ODPA, 24.83 g (100 millimoles) of pDDS, 7.01 g (25 millimoles) of ABPS, 64 g of γ-butyrolactone, 43 g of methyl benzoate and 40 g of toluene were added, and the resulting mixture was stirred at 180° C. at 180 rpm for 5 hours. The refluxed materials were removed from the system to obtain a polyimide solution having a concentration of 30%. The molecular weight, glass transition temperature and thermal decomposition initiation temperature thereof were measured.

Synthesis Example 5

The reaction of the first step was carried out in the same manner as in Synthesis Example 1, using 62.04 g (200 millimoles) of ODPA, 14.31 g (50 millimoles) of MBAA, 14.02 g (50 millimoles) of ABPS, 40 g of toluene, 3.00 g (30 millimoles) of γ-valerolactone, 4.75 g (60 millimoles) of pyridine, 92.67 g of γ-butyrolactone and 62 g of methyl benzoate.

After cooling the mixture to room temperature, 29.42 g (100 millimoles) of BPDA, 100.44 g (120 millimoles) of BY16-853U (amino equivalent: 456), 23.39 g (80 millimoles) of APB, 60 g of toluene, 177 g of γ-butyrolactone and 118 g of methyl benzoate were used to obtain a polyimide solution having a concentration of 35% in the same manner as in Synthesis Example 1.

Synthesis Example 6

The reaction of the first step was carried out in the same manner as in Synthesis Example 1, using 64.45 g (200 millimoles) of 3,3',4,4'-benzophenone tetracarboxylic dianhydride (BTDA), 18.31 g (50 millimoles) of 2,2-bis(3-amino-4-hydroxyphenyl) hexafluoropropane (Bis-AP-AF), 14.31 g (50 millimoles) of MBAA, 40 g of toluene, 3.00 g (30 millimoles) of γ-valerolactone, 4.75 g (60 millimoles) of pyridine, 126 g of γ-butyrolactone and 84 g of methyl benzoate.

After cooling the mixture to room temperature, 31.02 g (100 millimoles) of ODPA, 109.44 g (120 millimoles) of BY16-853U (amino equivalent: 456), 10.99 g (30 millimoles) of Bis-AP-AF, 14.62 g (50 millimoles) of APB, 60 g of toluene, 227 g of γ-butyrolactone and 152 g of methyl benzoate were used to obtain a polyimide solution having a concentration of 30% in the same manner as in Synthesis Example 1.

Synthesis Example 7

The reaction of the first step was carried out in the same manner as in Synthesis Example 1, using 62.04 g (200 millimoles) of ODPA, 28.03 g (100 millimoles) of ABPS, 60 g of toluene, 3.00 g (30 millimoles) of γ-valerolactone, 4.74 g (60 millimoles) of pyridine, 92 g of γ-butyrolactone and 62 g of methyl benzoate.

After cooling the mixture to room temperature, 31.02 g (100 millimoles) of ODPA, 120.40 g (140 millimoles) of diaminosiloxane compound KF-8010 (amino equivalent: 430) produced by Shin-etsu Chemical Co., Ltd., 8.59 g (30 millimoles) of MBAA, 8.77 g (30 millimoles) of APB, 40 g of toluene, 184 g of γ-butyrolactone and 123 g of methyl benzoate were used to obtain a polyimide solution having a concentration of 35% in the same manner as in Synthesis Example 1.

Synthesis Example 8

The reaction of the first step was carried out in the same manner as in Synthesis Example 1, using 58.84 g (200 millimoles) of BPDA, 86.00 g (100 millimoles) of diaminosiloxane compound KF-8010 (amino equivalent: 430) produced by Shin-etsu Chemical Co., Ltd., 60 g of toluene, 5.00 g (50 millimoles) of γ-valerolactone, 7.91 g (100 millimoles) of pyridine, 193 g of γ-butyrolactone and 128 g of methyl benzoate.

After cooling the mixture to room temperature, 88.27 g (300 millimoles) of BPDA, 56.06 g (200 millimoles) of APBS, 29.23 g (100 millimoles) of APB, 29.23 g (100 millimoles) of 1,3-bis-(4-aminophenoxy)benzene (TPE-R), 40 g of toluene, 269 g of γ-butyrolactone and 179 g of methyl benzoate were used to obtain a polyimide solution having a concentration of 30% in the same manner as in Synthesis Example 1.

Synthesis Example 9

The reaction of the first step was carried out in the same manner as in Synthesis Example 1, using 99.27 g (320 millimoles) of ODPA, 326.40 g (160 millimoles) of diaminosiloxane compound X-22-9415 (amino equivalent: 1020) produced by Shin-etsu Chemical Co., Ltd., 60 g of toluene, 5.00 g (50 millimoles) of γ-valerolactone, 7.74 g (98 millimoles) of pyridine, 265 g of γ-butyrolactone and 265 g of methyl benzoate.

After cooling the mixture to room temperature, 69.76 g (170 millimoles) of ethylene glycol-bis-trimellitic anhydride ester (TMEG-100), pDDS (50 millimoles), 36.43 g (130 millimoles) of ABPS, 43.85 g (150 millimoles) of APB, 40 g of toluene, 264 g of γ-butyrolactone and 264 g of methyl benzoate were used to obtain a polyimide solution having a concentration of 35% in the same manner as in Synthesis Example 1.

Synthesis Example 10

The reaction of the first step was carried out in the same manner as in Synthesis Example 1, using 62.04 g (200 millimoles) of ODPA, 161.00 g (100 millimoles) of diaminosiloxane compound X-22-161A (amino equivalent: 805) produced by Shin-etsu Chemical Co., Ltd., 60 g of toluene, 3.00 g (30 millimoles) of γ-valerolactone, 4.74 g (60 millimoles) of pyridine, 147 g of γ-butyrolactone and 147 g of methyl benzoate.

After cooling the mixture to room temperature, 45.83 g (100 millimoles) of p-phenylenebis (trimellitic monoester anhydride) (TAHQ), 14.02 g (50 millimoles) of ABPS, 14.31 g (50 millimoles) of MBAA, 29.23 g (100 millimoles) of APB, 40 g of toluene, 146 g of γ-butyrolactone and 146 g of methyl benzoate were used to obtain a polyimide solution having a concentration of 35% in the same manner as in Synthesis Example 1.

The molecular weight, glass transition temperature, thermal decomposition initiation temperature, tensile strength, tensile elastic modulus, elongation and so on were measured. The results are shown in Table 1.

Further, the basic characteristics of the polyimide varnishes synthesized in Synthesis Examples 1-8, that is, curling property[1], line-to-line insulation properties[2], resistance to soldering heat[3], fire retardancy[4] and adhesion to substrates[5] were measured. The results are shown in Table 2.

1) Radius of curvature of the curl of a protection-coated circuit member (5 cm×5 cm)
2) Value obtained by measurement according to JIS-05016
3) Examination of blisters and the like by visual observation of a protection-coated circuit member (5 cm×5 cm)
4) Flammability testing method according to UL safety standard After treating a cut out sample at 25° C., 50% RH for 24 hours, the sample is immersed in a solder bath, and processed according to the testing method.

5) Adhesive strength (peeling at 180°) to a polyimide film Kapton (EN) (in Table 2, indicated as "PI") and roll annealed copper foil BHY22BT (produced by Nikko Materials Co., Ltd.)

TABLE 1

| Synthesis Example | Resin Solid Content (%) | Weight Average Molecular Weight | Glass Transition Temperature/ °C. | Thermal Decomposition Initiation Temperature/°C. | Tensile Elastic Modulus (N/mm$^2$) | Tensile Strength (N/mm$^2$) | Elongation (%) |
|---|---|---|---|---|---|---|---|
| 1 | 35 | 55,000 | 175 | 436 | 738 | 34.1 | 150 |
| 2 | 30 | 35,000 | 250 | 410 | 48 | 12.3 | 23 |
| 3 | 30 | 57,000 | 153 | 436 | 34.1 | 34.5 | 50 |
| 4 | 30 | 50,000 | 253 | 439 | 234 | 30.1 | 80 |
| 5 | 35 | 53,000 | 143 | 425 | 628 | 29.4 | 100 |
| 6 | 30 | 55,000 | 152 | 412 | 642 | 25 | 16 |
| 7 | 35 | 57,000 | 164 | 415 | 410 | 8.6 | 80 |
| 8 | 30 | 60,000 | 246 | 430 | 1426 | 61.5 | 32 |
| 9 | 35 | 28,000 | 143 | 418 | 20 | 15.8 | 150 |
| 10 | 35 | 28,000 | 154 | 436 | 58 | 20.2 | 53 |

TABLE 2

| Synthesis Example | Curling Property[1] (mm) | Line-to-Line Insulation Resistance[2] (Ω) | Solder Heat Resistance[3] | Fire Retardancy[4] | Adhesion (N/cm) Initial[5] on Copper Foil | on PI | Adhesion (N/cm) 150° C.*10 on Copper Foil | on PI |
|---|---|---|---|---|---|---|---|---|
| 1 | 3 | 1.0 × 10$^{15}$ | 260° C. 30 sec | VTM0 | 6.0 | 11 | 5.5 | 12 |
| 2 | 0 | 3.0 × 10$^{15}$ | 280° C. 30 sec | VTM1 | 4.8 | 8 | 4.0 | 8.5 |
| 3 | 1 | 3.0 × 10$^{15}$ | 260° C. 30 sec | VTM0 | 5.8 | 11 | 5.5 | 10 |
| 4 | 0 | 2.0 × 10$^{15}$ | 280° C. 30 sec | VTM1 | 4.6 | 9 | 4.2 | 8 |
| 5 | 0 | 1.0 × 10$^{14}$ | 280° C. 60 sec | VTM0 | 6.0 | 11 | 5.5 | 12 |
| 6 | 1 | 3.0 × 10$^{15}$ | 260° C. 30 sec | VTM0 | 4.8 | 8 | 4.0 | 8.5 |
| 7 | 1 | 3.0 × 10$^{15}$ | 260° C. 30 sec | VTM1 | 5.8 | 10 | 4.8 | 9.5 |
| 8 | 10 | 2.0 × 10$^{15}$ | 280° C. 60 sec | VTM0 | 6.8 | 10 | 5.8 | 8.6 |
| 9 | 0 | 2.5 × 10$^{15}$ | 280° C. 60 sec | VTM1 | 6.1 | 10 | 5.8 | 9.6 |
| 10 | 0 | 2.4 × 10$^{15}$ | 280° C. 60 sec | VTM0 | 5.5 | 10 | 5.3 | 9.0 |

Examples 1 to 18

Preparation of Ink Compositions

Each of the polyimide block copolymer solutions (Synthesis Examples 1-10 (30% by weight)) synthesized by the method described above in an amount of 50 g (the polyimide block copolymer resin component was 15 g) was sampled, and an ester between 2,3,4-trihydroxybenzophenone and 6-diazo-5,6-dihydro-5-oxo-naphthalen-1-sulfonic acid (4NT-300, commercial product of Toyo Gosei Co., Ltd.) was added (15% by weight based on the polyimide resin) and KS-603 (1 to 3% by weight based on the polyimide resin) produced by Shin-etsu Chemical Co., Ltd. as a defoaming agent was added.

Each of the above-described ink compositions was coated on the glossy surface of a roll annealed copper foil BHY22BT (produced by Nikko Materials Co., Ltd.) sizing 25 cm×25 cm by screen printing, and dried in an infrared dryer at 90° C. for 20 minutes. The film thickness of this photoresist was about 15 μm. On this photoresist coating layer, a test pattern (through holes and line-and-space pattern having diameters and widths of 10, 15, 20, 25, - - -, and 200 μm, respectively) for positive-type photomask was placed, and the coated layer was irradiated at a dose of exposure at which images are obtained using 2 kW extra-high pressure mercury lamp apparatus (JP-2000G, commercial product of Oak Seisakusho). Each sample irradiated with an energy of 500 mJ to 20,000 mJ was spray developed with a developer (the developer was a mixture of 3% aqueous sodium hydroxide solution and 0.5% aminoethanol). When the dose of irradiation was 1000 mJ, development was carried out with the developer at 40° C. for 0.5 to 3 minutes, and the resultant was washed with deionized water and dried in a hot air drying oven, followed by observation of the resolution. The polyimide film thickness of the coated polyimide film after drying at 120° C. for 60 minutes and at 200° C. for 30 minutes was about 14 μm. The results of the measurement of the diameters of the through hole pattern and line width of the line-and-space pattern of the polyimide block copolymer coated film obtained by the method described above are shown in Table 3.

TABLE 3

| Example | Polyimide Varnish Synthesis Example | Solids Concentration (%) | Dose of Exposure (mj/cm$^2$) | Photosensitizer and Defoaming Agent [1] Type of Photosensitizer | Amount added (part) | Type of Defoaming Agent | Amount added (part) | Resolution Performance Aperture Diameter of Hole Pattern (μm) | Line Width (L/S) (μm) |
|---|---|---|---|---|---|---|---|---|---|
| 1 | 1 | 30 | 1000 | 4NT-300 | 15 | KS-603 | 3 | 40 | 30/30 |
| 2 | 1 | 30 | 1500 | 4NT-300 | 15 | KS-603 | 3 | 40 | 30/30 |
| 3 | 2 | 30 | 1000 | 4NT-300 | 15 | KS-603 | 3 | 60 | 50/50 |
| 4 | 2 | 30 | 1500 | 4NT-300 | 15 | KS-603 | 3 | 50 | 40/40 |
| 5 | 3 | 30 | 1000 | 4NT-300 | 15 | KS-603 | 3 | 50 | 50/50 |
| 6 | 3 | 30 | 1500 | 4NT-300 | 15 | KS-603 | 3 | 40 | 30/30 |
| 7 | 4 | 30 | 1000 | 4NT-300 | 15 | KS-603 | 3 | 50 | 40/40 |
| 8 | 4 | 30 | 1500 | 4NT-300 | 15 | KS-603 | 3 | 30 | 30/30 |
| 9 | 5 | 30 | 1000 | 4NT-300 | 15 | KS-603 | 3 | 50 | 40/40 |
| 10 | 5 | 30 | 1500 | 4NT-300 | 15 | KS-603 | 3 | 30 | 30/30 |
| 11 | 6 | 30 | 1000 | 4NT-300 | 15 | KS-603 | 3 | 50 | 40/40 |
| 12 | 6 | 30 | 1500 | 4NT-300 | 15 | KS-603 | 3 | 30 | 30/30 |
| 13 | 7 | 30 | 1000 | 4NT-300 | 15 | KS-603 | 3 | 50 | 30/30 |
| 14 | 7 | 30 | 1500 | 4NT-300 | 15 | KS-603 | 3 | 30 | 30/30 |
| 15 | 8 | 30 | 1000 | 4NT-300 | 15 | KS-603 | 3 | 30 | 30/30 |
| 16 | 8 | 30 | 1500 | 4NT-300 | 15 | KS-603 | 3 | 30 | 30/30 |
| 17 | 9 | 30 | 1500 | 4NT-300 | 15 | KS-603 | 3 | 30 | 30/30 |
| 18 | 10 | 30 | 1500 | 4NT-300 | 15 | KS-603 | 3 | 30 | 30/30 |

Note:
[1] The contents of the photosensitizer and the defoaming agent are the amount added (parts by weight) with respect to 100 parts by weight of the polyimide resin solids Evaluation Example 2

(Evaluation of Printing Property)

Printing was carried out using a mask of fill pattern for testing produced by PI R&D Co., Ltd. and using MT-550TVC screen printing machine produced by Microtek. Each of the printing plate used in the evaluation was subjected to printing using a printing screen for testing produced by PI R&D Co., Ltd. (165 mesh-3D, made of stainless steel, emulsion thickness of 15 μm), frame size (200 mm×250 mm), under the following printing conditions: squeegee speed: 50 to 100 mm/min; gap (clearance): 1.5 mm to 2.0 mm; squeegee pressure: 0.1 to 0.2 MPa, and the characteristics below were evaluated.

After continuously carrying out 20 shots of printing on copper substrates, leveling was performed at room temperature for 5 to 10 minutes, and the resultant was heated in a hot air oven at 90° C. for 30 minutes, followed by evaluation by visual observation and by observation with a light microscope. The evaluation was performed on "bleeding", "void or chipping" and "rolling property (insufficient roll flowing when the paste roll-flows in substantially cylindrical shape in front of the squeegee in the direction of movement of the squeegee on the screen when the squeegee moves)". The results are shown in Table 4.

TABLE 4

| Example | Number of Defective Pattern Shape (N = 10) | | | | | |
|---|---|---|---|---|---|---|
| | Bleeding or Sagging | Blur | Void or Chipping | Rolling Property | Total | Form Evaluation |
| Example 1 | 0 | 0 | 0 | ⊚ | 0 | Good |
| Example 3 | 0 | 0 | 0 | ○ | 0 | Good |
| Example 5 | 0 | 0 | 0 | ○ | 0 | Good |
| Example 7 | 0 | 0 | 0 | ○ | 0 | Good |
| Example 9 | 0 | 0 | 0 | ○ | 0 | Good |
| Example 11 | 0 | 0 | 0 | ⊚ | 0 | Good |
| Example 13 | 0 | 0 | 0 | ○ | 0 | Good |
| Example 15 | 0 | 0 | 0 | ⊚ | 0 | Good |

(Continuous Printing Property)

This evaluation is for checking whether printing can be carried out continuously 100 times without changing the film thickness. The above-described fill pattern was continuously printed, and the printed product obtained by the 10th shot was sampled, and thereafter the printed products were sampled every 10 shots until 100th shot. Each sample was dried under the conditions described above, and the above-described shapes were observed by visual observation and with light microscope. The results are shown in Table 5. In the table, the mark "o" indicates that the shape of the film was good, and the mark "X" indicates that the shape of the film was not good. In cases where the shape of the film became extremely bad, the printing was stopped.

TABLE 5

| Example | Number of Continuous Shot | | | | | | | | | |
|---|---|---|---|---|---|---|---|---|---|---|
| | 10 | 20 | 30 | 40 | 50 | 60 | 70 | 80 | 90 | 100 |
| Example 1 | ○ | ○ | ○ | ○ | ○ | ○ | ○ | ○ | ○ | ○ |
| Example 3 | ○ | ○ | ○ | ○ | ○ | ○ | ○ | ○ | ○ | ○ |
| Example 5 | ○ | ○ | ○ | ○ | ○ | ○ | ○ | ○ | ○ | ○ |
| Example 7 | ○ | ○ | ○ | ○ | ○ | ○ | ○ | ○ | ○ | ○ |
| Example 9 | ○ | ○ | ○ | ○ | ○ | ○ | ○ | ○ | ○ | ○ |
| Example 11 | ○ | ○ | ○ | ○ | ○ | ○ | ○ | ○ | ○ | ○ |
| Example 13 | ○ | ○ | ○ | ○ | ○ | ○ | ○ | ○ | ○ | ○ |
| Example 15 | ○ | ○ | ○ | ○ | ○ | ○ | ○ | ○ | ○ | ○ |

As can be seen from Tables 4 and 5, the photosensitive polyimide ink for printing according to the present invention was excellent in the film shape and the continuous printing property.

INDUSTRIAL APPLICABILITY

The ink composition for screen printing according to the present invention is suited as a photosensitive ink for forming protective layers in flexible circuit boards and circuit boards; for forming insulating layers of laminate substrates; for protection, insulation or adhesion of silicon wafers, semiconductor chips, peripheral parts of semiconductor devices, substrates for mounting semiconductor chips, radiator plates, lead pins and semiconductors per se used for semiconductor devices.

In the conventional formation of images in the polyimide films for surface protection or interlayer insulation, used as industrial coating materials such as surface coating materials of flexible printed boards, inner layer coating materials of multilayer rigid boards, and coating materials for liquid crystal alignment layers, ICs and LSIs, the holes are formed only at the prescribed positions in the coverlay film by laser etching, plasma etching or the like, after heat pressing a coverlay film made of a polyimide film or the like having an adhesive on one side thereof with a flexible circuit board. By this method, although the positioning precision is very high, there is a drawback in that holing is time-consuming and the costs of apparatus and running thereof are high. In recent years, use of polyimides in the field of electronics was widened because the technology of photoprinting using photosensitive polyimides was greatly advanced, and the image-formation process was simplified. By using the photosensitive polyimide ink composition according to the present invention, images can be formed more simply than the conventional photoething, by performing the steps of exposure and development.

The invention claimed is:

1. A photosensitive ink composition for screen printing, said ink composition comprising:
    100 parts by weight of an organic solvent-soluble polyimide block copolymer(s); and
    1 to 100 parts by weight of a photoacid generator(s), said polyimide block copolymer(s) and said photoacid generator(s) being dissolved in an organic solvent, said polyimide block copolymer(s) containing in its molecular skeleton a diamine having a siloxane bond(s), and an aromatic diamine having a hydroxyl group(s) and/or carboxyl group(s) at ortho-position with respect to an amino group;
    and wherein the content of said diamine(s) having a siloxane bond in the molecular skeleton thereof is 15 to 85% by weight based on the total diamine components, and the content of said aromatic diamine(s) having said hydroxyl group(s) and/or carboxyl group(s) is 5 to 20% by weight based on the total diamine components.

2. The composition according to claim 1, wherein said aromatic diamine having a hydroxyl group(s) and/or carboxyl group(s) is at least one selected from the group consisting of 3,3'-dicarboxy-4,4'-diaminodiphenylmethane, 2,2-bis(3-amino-4-hydroxyphenyl)propane, 1-hydroxy-2,4-diaminobenzene, 3,3'-dihydroxybenzidine, 3,3'-dihydroxy-4,4'-diaminodiphenyl ether, 1,4-bis-(3-hydroxy-4-aminophenoxy)benzene, 2,2-bis(4-amino-3-hydroxyphenyl)propane, bis(3-amino-4-hydroxyphenyl)propane, 2,2-bis(3-amino-4-hydroxyphenyl)hexafluoropropane, bis(3-amino-4-hydroxyphenyl)sulfone, bis(3-amino-4-hydroxyphenyl)sulfide and 2,2-bis(3-amino-4-hydroxyphenyl)hexafluoropropane.

3. The composition according to claim 1, wherein said diamine having a siloxane bond is one or more diamines having a structure represented by any one of Formulae (I) to (IV) below:

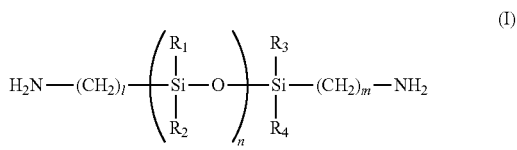

(I)

(wherein in Formula (I), $R_1$, $R_2$, $R_3$ and $R_4$ each independently represent an alkyl group, cycloalkyl group, phenyl group or a phenyl group substituted by 1 to 3 alkyl groups or by 1 to 3 alkoxyl groups; l and m each independently represent an integer of 1 to 4; and n represents an integer of 3 to 30)

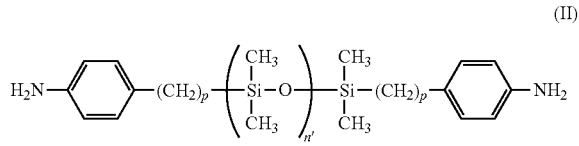

(II)

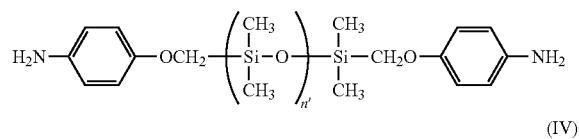

(III)

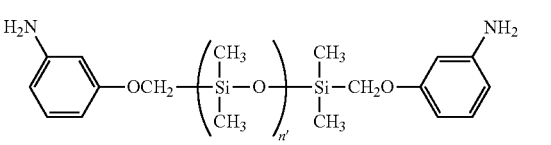

(IV)

(wherein in Formulae (II) to (IV), n' represents an integer of 1 to 30; and p in Formula (II) represents an integer of 1 to 4).

4. The composition according to claim 3, wherein said diamine having a siloxane bond has the structure represented by said Formula (I).

5. The composition according to claim 1 wherein the tetracarboxylic dianhydride component(s) constituting said block polyimide block copolymer(s) is(are) at least one selected from the group consisting of bis-(3,4-dicarboxyphenyl) ether diacid dianhydride, 3,3 ', 4,4'-biphenyltetracarboxylic dianhydride, p-phenylenebis(trimellitic acid monoester acid anhydride) and bicyclo[2,2,2]oct-2-ene tetracarboxylic dianhydride (BCD).

6. The composition according to claim 1, wherein said polyimide block copolymer(s) has(have) a weight average molecular weight in terms of polystyrene of 20,000 to 200,000.

7. A method for forming a positive-type relief pattern, said method comprising:
    coating said composition according to claim 1 on a substrate by screen printing;
    radiating an active light source in the form of said pattern; and
    developing the irradiated regions with an alkaline developer.

* * * * *